US011437398B2

(12) United States Patent
Xu et al.

(10) Patent No.: US 11,437,398 B2
(45) Date of Patent: Sep. 6, 2022

(54) THREE-DIMENSIONAL MEMORY DEVICE WITH SOURCE STRUCTURE AND METHODS FOR FORMING THE SAME

(71) Applicant: YANGTZE MEMORY TECHNOLOGIES CO., LTD., Wuhan (CN)

(72) Inventors: Wenxiang Xu, Wuhan (CN); Wei Xu, Wuhan (CN); Pan Huang, Wuhan (CN); Ji Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 162 days.

(21) Appl. No.: 16/863,203

(22) Filed: Apr. 30, 2020

(65) Prior Publication Data
US 2021/0272978 A1  Sep. 2, 2021

Related U.S. Application Data

(63) Continuation of application No. PCT/CN2020/077407, filed on Mar. 2, 2020.

(51) Int. Cl.
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ................................. H01L 27/11578
See application file for complete search history.

(56) References Cited

U.S. PATENT DOCUMENTS

2021/0050367 A1*  2/2021  Xu ............... H01L 21/76877

FOREIGN PATENT DOCUMENTS

| CN | 110622309 A | 12/2019 |
|---|---|---|
| CN | 110622310 A | 12/2019 |
| CN | 110622312 A | 12/2019 |
| CN | 110741474 A | 1/2020 |
| CN | 110770904 A | 2/2020 |

* cited by examiner

Primary Examiner — Christopher A Johnson
(74) Attorney, Agent, or Firm — Bayes PLLC

(57) ABSTRACT

Embodiments of structure and methods for forming a three-dimensional (3D) memory device are provided. In an example, a 3D memory device includes a memory stack over a substrate, a plurality of channel structures, a source structure, and a support structure. The memory stack includes interleaved a plurality of conductor layers and a plurality of insulating layers. The plurality of channel structures extend vertically in the memory stack. The source structure includes a plurality of source portions and extending in the memory stack. The support structure is between adjacent ones of the source portions and has a plurality of interleaved conductor portions and insulating portions. A top one of the conductor portions is in contact with a top one of the conductor layers. Adjacent ones of the source portions are conductively connected to one another.

20 Claims, 12 Drawing Sheets

100

THREE-DIMENSIONAL MEMORY DEVICE WITH SOURCE STRUCTURE AND METHODS FOR FORMING THE SAME

CROSS-REFERENCE TO RELATED APPLICATIONS

This application is continuation of International Application No. PCT/CN2020/077407, filed on Mar. 2, 2020, entitled "THREE-DIMENSIONAL MEMORY DEVICE WITH SOURCE STRUCTURE AND METHODS FOR FORMING THE SAME," which is hereby incorporated by reference in its entirety.

BACKGROUND

Embodiments of the present disclosure relate to three-dimensional (3D) memory devices having source structures of reduced resistance and improved support, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, a 3D memory device includes a memory stack over a substrate, a plurality of channel structures, a source structure, and a support structure. The memory stack includes interleaved a plurality of conductor layers and a plurality of insulating layers. The plurality of channel structures extend vertically in the memory stack. The source structure includes a plurality of source portions and extending in the memory stack. The support structure is between adjacent ones of the source portions and has a plurality of interleaved conductor portions and insulating portions. A top one of the conductor portions is in contact with a top one of the conductor layers. Adjacent ones of the source portions are conductively connected to one another.

In another example, a 3D memory device includes a memory stack, a plurality of channel structures, a source structure, and a support structure. The memory stack has a plurality of memory blocks over a substrate, each of the memory blocks having interleaved a plurality of conductor layers and a plurality of insulating layers. The plurality of channel structures extend vertically in the memory blocks. The source structure extend between adjacent memory blocks. The support structure is in contact with the source structure and having a plurality of interleaved conductor portions and insulating portions. Adjacent memory blocks are in contact with each other through the support structure. A top one of the conductor portions is in contact with a top one of the conductor layers in each of the adjacent memory blocks.

In a further example, a method for forming a 3D memory device includes the following operations. First, a slit structure and a support structure are formed in a stack structure having interleaved a plurality of sacrificial material layers and a plurality of insulating material layers, the initial support structure between adjacent slit openings of the slit structure. A source structure is formed to include a source portion in each of the slit openings. A pair of first portions of a connection layer is formed in contact with and conductively connected to the source portion. A second portion of the connection layer is formed in contact with and conductively to the pair of first portions of the connection layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
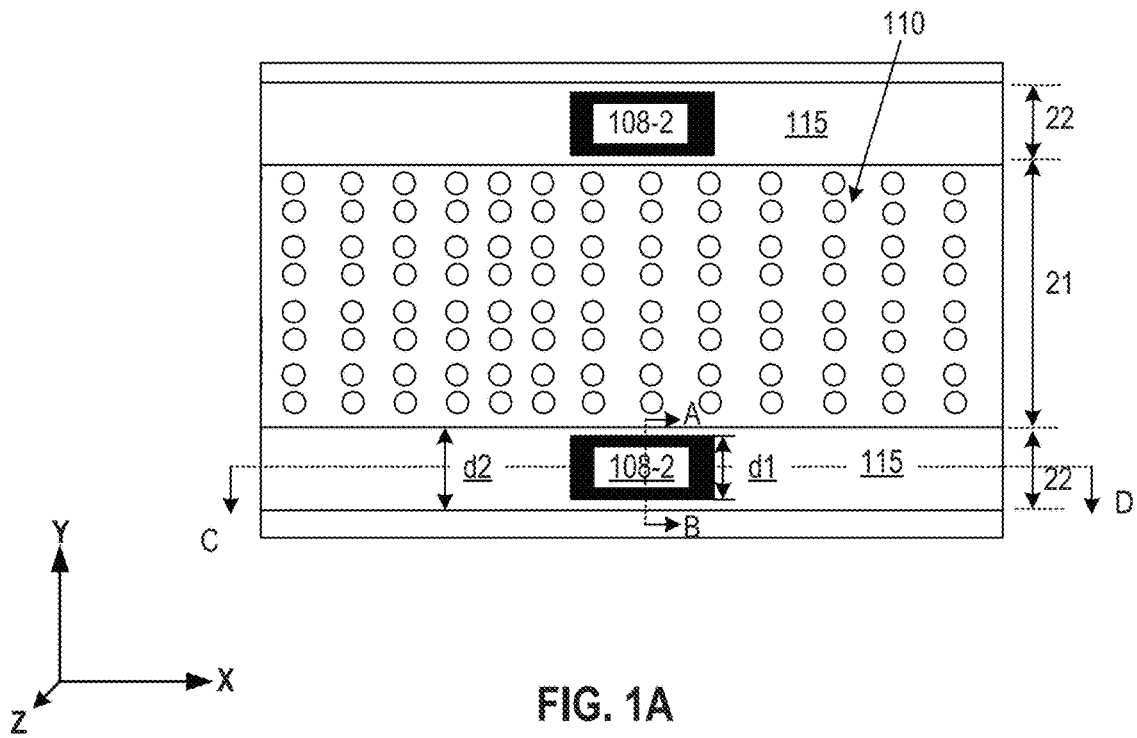
FIG. 1A illustrates a plan view of an exemplary 3D memory device having source structures of reduced resistance and improved support, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic products, are non-volatile, light-weighted, of low power consumption and good performance. Currently, planar NAND flash memory devices have reached its storage limit. To further increase the storage capacity and reduce the storage cost per bit, 3D NAND memory devices have been proposed. An existing 3D NAND memory device often includes a plurality of memory blocks. Adjacent memory blocks are often separated by a GLS, in which an array common source (ACS) is formed. In the fabrication method to form the existing 3D NAND memory device, due to an increased number of levels (or conductor/insulator pairs), the etching process to form GLSs become challenging. For example, the GLSs can be more susceptible to deformation, e.g., fluctuation of feature size, causing memory blocks neighboring the GLSs to deform or even collapse. The performance of the 3D NAND memory device can be affected.

Figure 9:
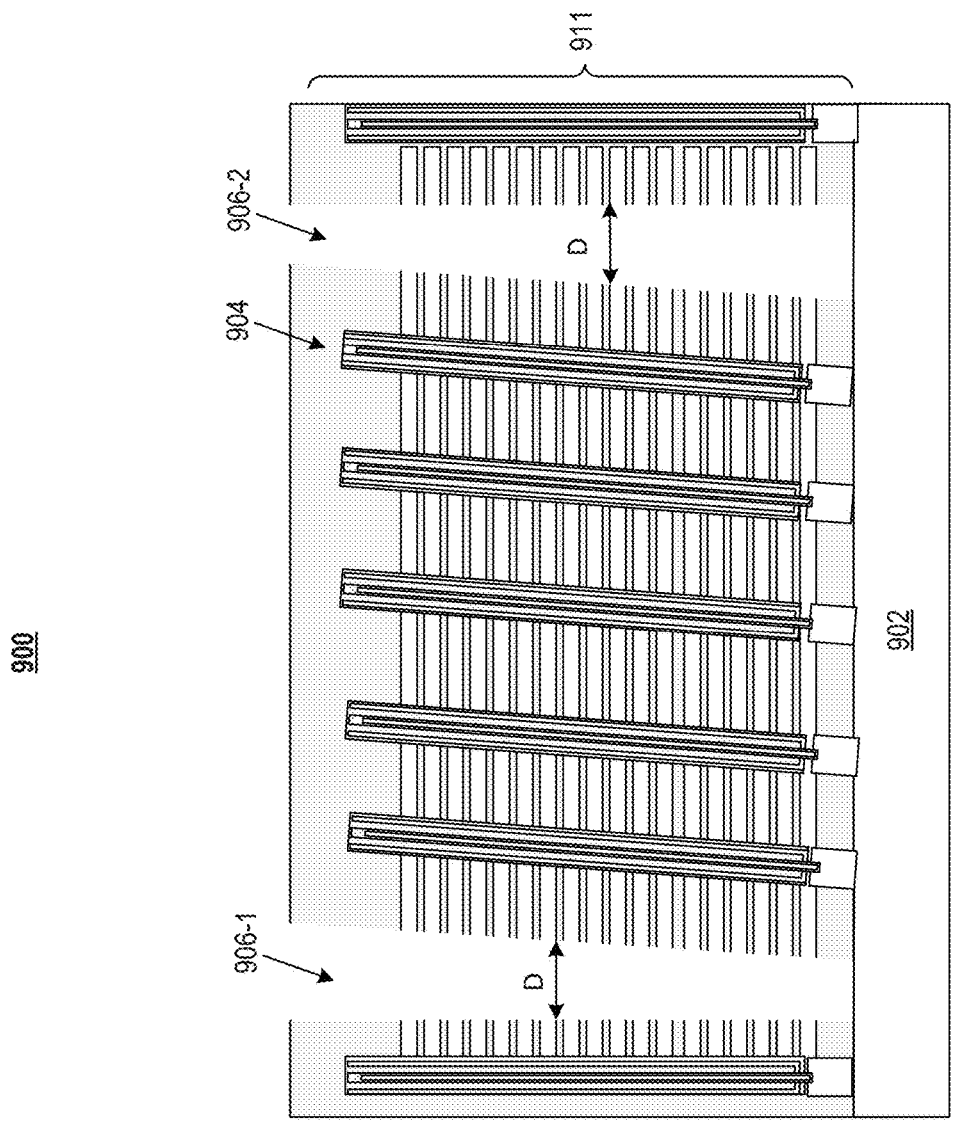
FIG. 9 illustrates a cross-sectional view of an existing 3D memory device with deformed gate line slits (GLSs).

FIG. 9 illustrates an existing 3D memory device 900 with deformed GLSs and a deformed memory block. As shown in FIG. 9, a memory stack 911 is formed over a substrate 902. A plurality of GLS, e.g., 906-1 and 906-2, extend through memory stack 911 to expose substrate 902. A plurality of channel structures 904 are arranged in a memory block between GLSs 906-1 and 906-2. Due to deformation, a lateral dimension, e.g., diameter D, of GLS (e.g., 906-1 or 906-2) varies along the vertical direction (e.g., the z-direction), causing the memory block and channel structures 904, to move from their desired position/orientation. These deformations can lead to photolithography misalignment and electrical leakage in subsequent fabrication processes that form ACSs in the GLSs.

The present disclosure provides 3D memory devices (e.g., 3D NAND memory devices) having source structures with reduced resistance and improved support, and methods for forming the 3D memory devices. A 3D memory device employs one or more support structures that divide a slit structure into a plurality of slit openings, in which source portions are formed. The support structures are each in contact with adjacent memory blocks, providing support to the entire structure of the 3D memory device during the formation of conductor layers/portions and source contacts.

The 3D memory device is then less susceptible to deformation or damages during the fabrication process.

In the 3D memory device, at least two adjacent source portions are in contact with and conductively connected to one another through a connection layer, which includes a conductive material such as tungsten. One or more pairs of adjacent source portions in a source structure can be in contact with and conductively connected together by the connection layer. Instead of applying a source voltage on each of the plurality of source portions using a respective contact plug, the source voltage is applied on the source portions (e.g., the source portions that are in contact with connection layer) through the connection layer(s), reducing or eliminating the use of contact plugs. The resistance of the source structure can be reduced. The contact area between the connection layer and a source portion can be sufficiently large to further reduce the resistance of the source structure. In some embodiments, the connection layer is in contact with and conductively connected to all the source portions in a source structure, further reducing the resistance of the source structure. In addition, the fabrication of the support structures and the source structures do not require additional fabrication steps or fabrication cost.

Figure 1B:
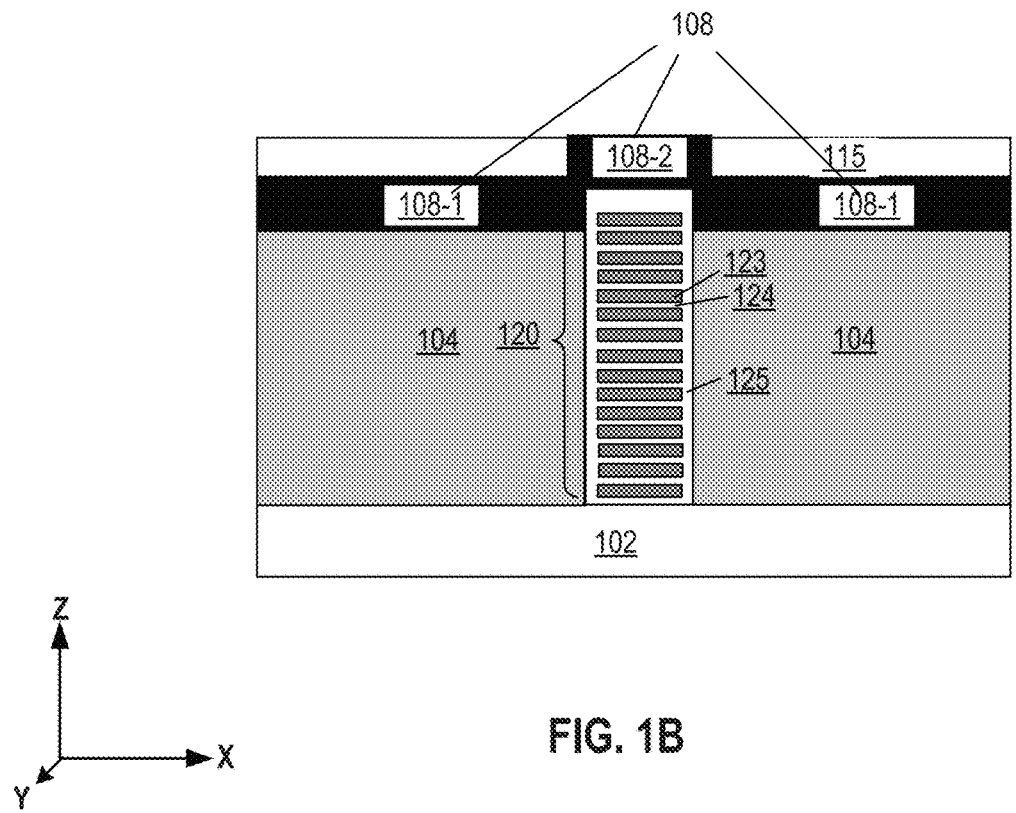
FIG. 1B illustrates a cross-sectional view of the 3D memory device illustrated in FIG. 1A along the C-D direction, according to some embodiments of the present disclosure.
Figure 1C:
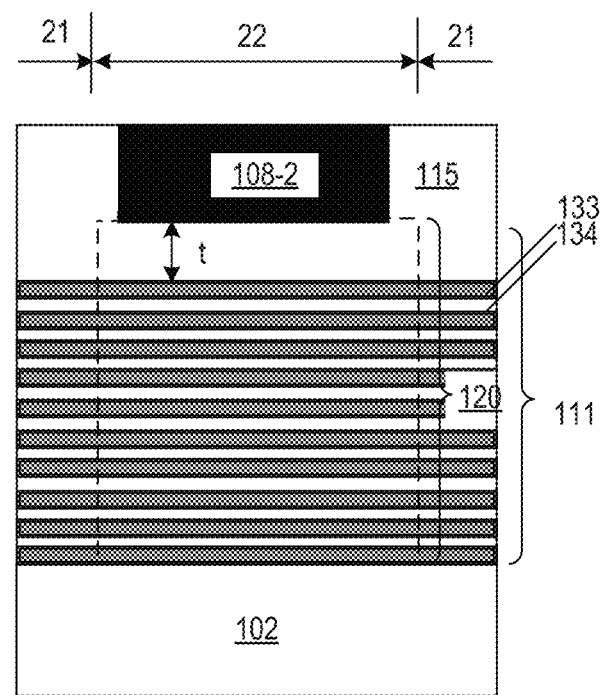
FIG. 1C illustrates a cross-sectional view of the 3D memory device illustrated in FIG. 1A along the A-B direction, according to some embodiments of the present disclosure.

FIG. 1A illustrates a plan view of an exemplary 3D memory device 100, according to some embodiments. FIG. 1B illustrates a cross-sectional view of the 3D memory device 100 shown in FIG. 1A along the C-D direction. FIG. 1C illustrates a cross-sectional view of the 3D memory device 100 shown in FIG. 1A along the A-B direction. As shown in FIG. 1A, 3D memory device 100 may include a core region in which one or more, e.g., a pair of, source regions 22 extend along the x-direction. A source structure may be formed in each source region 22. One or more block regions 21, in which a plurality of memory cells are formed, may be between the pair of source regions 22. A memory block may be formed in each block region 21.

As shown in FIGS. 1A-1C, 3D memory device 100 may include a substrate 102, and a stack structure 111 over substrate 102. In block regions 21, stack structure 111 may include a plurality of conductor layers 133 and a plurality of insulating layers 134 interleaved over substrate 102. In block region 21, stack structure 111 may also include a plurality of channel structures 110 extending through stack structure 111 into substrate 102 along a vertical direction (e.g., the z-direction). Each channel structure 110 may include an epitaxial portion at a bottom portion, a drain structure at a top portion, and a semiconductor channel between the epitaxial portion and the drain structure. The semiconductor channel may include a memory film, a semiconductor layer, and in some embodiments, a dielectric core. The epitaxial portion may be in contact with and conductively connected to substrate 102. The semiconductor channel may be in contact with and conductively connected to the drain structure and the epitaxial portion. A plurality of memory cells may be formed by the semiconductor channels and control conductor layers.

A source structure may be formed in source region 22 to extend along the x-direction. The source structure may include a plurality of source portions 104 each including a respective insulating structure and a source contact (detail not shown). Source portions 104 formed in one source region 22 (e.g., within the same source structure) may be aligned along the x-direction. The source structures may each extend vertically through stack structure 111 and contact substrate 102. A source voltage can be applied to the memory cells through the source structure and substrate 102.

3D memory device 100 may include one or more support structures 120 aligned along the x-direction and dividing a source structure into the plurality of source portions 104. In some embodiments, support structure 120 includes interleaved a plurality of conductor portions 123 and insulating portions 124 over substrate 102. Each support structure 120 may be in contact with adjacent memory blocks (or block regions 21) along the y-direction, and in contact with insulating structures of adjacent source portions 104 along the x-direction. In some embodiments, support structure 120 includes a spacer layer 125 over and surrounding (e.g., covering) conductor portions 123 and insulating portions 124. Spacer layer 125 may provide further insulation between conductor portions 123 and adjacent source portions 104. In some embodiments, support structure 120 provides support to 3D memory device 100 during the formation of the source structures and conductor layers 133.

3D memory device 100 may further include a connection layer 108 in contact with and conductively connected to at least two adjacent source portions 104, and a dielectric cap layer 115 partially covering connection layer 108. Dielectric cap layer 115 may cover portions of connection layer 108 that is in contact with and over source portions 104, and expose the portions of connection layer 108 between adjacent source portions 104. Contact plugs (not shown) for conductively applying a source voltage can be formed on the exposed portions of connection layer 108. In some embodiments, connection layer 108 is over and in contact with all the source portions 104 in a source structure so that source voltage can be applied on all the source portions 104 of the source structure through connection layer 108. The resistance of the source structure can be reduced compared to applying the source voltage onto each source portion 104 using a respective contact plug. In some embodiments, dielectric cap layer 115 also covers at least a portion of block region 21. In some embodiments, dielectric cap layer 115 covers all channel structures 110 in block region 21. Contact plugs (not shown) for conductively applying a drain voltage can be formed extending through dielectric cap layer 115 and form contact with channel structures 110. For ease of illustration, coverage of dielectric cap layer 115 in block region 21 is not depicted. Details of each structure illustrated in FIGS. 1A-1C are described below.

Substrate 102 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes silicon.

Channel structures 110 may form an array and may each extend vertically above substrate 102. Channel structure 110 may extend through a plurality of pairs each including a conductor layer 133 and an insulating layer 134 (referred to herein as "conductor/insulating layer pairs"). At least on one side along a horizontal direction (e.g., x-direction and/or y-direction), stack structure 111 can include a staircase structure (not shown). The number of the conductor/insulating layer pairs in stack structure 111 (e.g., 32, 64, 96, or 128) determines the number of memory cells in 3D memory device 100. In some embodiments, conductor layers 133 and insulating layers 134 in stack structure 111 are alternatingly arranged along the vertical direction in block regions 21. Conductor layers 133 can include conductive materials including, but not limited to, tungsten (W), cobalt (Co), copper (Cu), aluminum (Al), polysilicon, doped silicon, silicides, or any combination thereof. Insulating layers 134 can include dielectric materials including, but not limited to, silicon oxide, silicon nitride, silicon oxynitride, or any combination thereof. In some embodiments, conductor layers 133 may include a top conductor layer having a plurality of top select conductor layers, and a bottom conductor layer having a plurality of bottom select conductor layers. The top select conductor layers may function as the top select gate electrodes, and the bottom select conductor layers may function as the bottom select gate electrodes. Conductor layers 133 between the top and bottom conductor layers may function as select gate electrodes and form memory cells with intersecting channel structures 110. Top select gate electrodes and bottom select gate electrodes can respectively be applied with desired voltages to select a desired memory block/finger/page.

Channel structure 110 can include a semiconductor channel extending vertically through stack structure 111. The semiconductor channel can include a channel hole filled with a channel-forming structure, e.g., semiconductor materials (e.g., as a semiconductor layer) and dielectric materials (e.g., as a memory film). In some embodiments, the semiconductor layer includes silicon, such as amorphous silicon, polysilicon, or single crystalline silicon. In some embodiments, the memory film is a composite layer including a tunneling layer, a memory layer (also known as a "charge trap layer"), and a blocking layer. The remaining space of the channel hole of semiconductor channel can be partially or fully filled with a dielectric core including dielectric materials, such as silicon oxide. The semiconductor channel can have a cylinder shape (e.g., a pillar shape). The dielectric core, semiconductor layer, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 110 further includes an epitaxial portion (e.g., a semiconductor plug) in the lower portion (e.g., at the lower end of bottom) of channel structure 110. As used herein, the "upper end" of a component (e.g., channel structure 110) is the end farther away from substrate 102 in the vertical direction, and the "lower end" of the component (e.g., channel structure 110) is the end closer to substrate 102 in the vertical direction when substrate 102 is positioned in the lowest plane of 3D memory device 100. The epitaxial portion can include a semiconductor material, such as silicon, which is epitaxially grown from substrate 102 in any suitable directions. It is understood that in some embodiments, the epitaxial portion includes single crystalline silicon, the same material as substrate 102. In other words, the epitaxial portion can include an epitaxially-grown semiconductor layer grown from substrate 102. The epitaxial portion can also include a different material than substrate 102. In some embodiments, the epitaxial portion includes at least one of silicon, germanium, and silicon germanium. In some embodiments, part of the epitaxial portion is above the top surface of substrate 102 and in contact with semiconductor channel. The epitaxial portion may be conductively connected to semiconductor channel. In some embodiments, a top surface of the epitaxial portion is located between a top surface and a bottom surface of a bottom insulating layer 134 (e.g., the insulating layer at the bottom of stack structure 111).

In some embodiments, channel structure 110 further includes a drain structure (e.g., channel plug) in the upper portion (e.g., at the upper end) of channel structure 110. The drain structure can be in contact with the upper end of a semiconductor channel and may be conductively connected to the semiconductor channel. The drain structure can include semiconductor materials (e.g., polysilicon) or conductive materials (e.g., metals). In some embodiments, the drain structure includes an opening filled with Ti/TiN or Ta/TaN as an adhesion layer and tungsten as a conductor material. By covering the upper end of semiconductor channel during the fabrication of 3D memory device 100, the drain structure can function as an etch stop layer to prevent etching of dielectrics filled in the semiconductor channel, such as silicon oxide and silicon nitride.

As shown in FIGS. 1A-1C, a source structure can be formed in source region 22. The source structure, aligned along the x-direction, may include a plurality of source portions 104 each including a source contact in a respective insulating structure (not shown). Each source portion 104 may be in contact with and conductively connected to substrate 102. The insulating structure may insulate the respective source portion 104 (or respective source contact) from conductor layers 133 in adjacent block regions 21. In some embodiments, the source contacts in source portions 104 include at least one of polysilicon, aluminum, cobalt, copper, and silicides. The insulating structures can each include a suitable dielectric material, such as one or more of silicon oxide, silicon nitride, and silicon oxynitride.

One or more support structures 120 may be distributed in a respective source structure along the x-direction. In some embodiments, the support structures 120 divides the respective source structure into a plurality of source portions 104. In some embodiments, each source portion 104 is separated from another source portion 104 by a support structure 120. Support structure 120, in contact with portions (e.g., memory blocks) of stack structure 111 in adjacent block regions 21, may include interleaved a plurality of conductor portions 123 and a plurality of insulating portions 124. In some embodiments, each conductor portions 123 is respectively in contact with corresponding conductor layers 133 of the same level in adjacent block regions 21 (e.g., in adjacent memory blocks), and each insulating portions 124 is respectively in contact with corresponding insulating layers 134 of the same level in adjacent block regions 21 (e.g., in adjacent memory blocks). In some embodiments, the top conductor portion 123 in support structure 120 is in contact with (e.g., coplanar with) the top conductor layer 133 in adjacent block regions 21. In some embodiments, the top insulating portion 124 in support structure 120 is in contact with the top insulating layer 134 in adjacent block regions 21.

In some embodiments, support structure 120 includes a spacer layer 125 covering and surrounding conductor portions 123 and insulating portions 124. Spacer layer 125 may provide further insulation between conductor portions 123 and adjacent source portions 104. In some embodiments, spacer layer 125 (and the top insulating portion 124, if top conductor portion 123 is under top insulating portion 124) forms a layer of dielectric material at the top portion of support structure 120 (e.g., between connection layer 108 and top conductor portion 123). In some embodiments, a thickness t of the layer of dielectric material along the z-direction is greater than zero. In some embodiments, a top surface of source portion 104 is lower than a top surface of support structure 120 along the z-direction. In some embodiments, the top surface of source portion 104 is lower than the top conductor portion 123 (e.g., the top and bottom surfaces of top conductor portion 123). In some embodiments, of the same source structure, top surfaces of all source portions 104 are lower than top surfaces of all support structures 120. In some embodiments, a width of support structure 120 along the y-direction may nominally equal to a width of the source structure.

Each source structure may further include connection layer 108 over and in contact with at least two adjacent source portions 104. For example, connection layer 108 may be in contact with and conductively connected to one or more pairs of adjacent source portions 104. Connection layer 108 may be conductively connected to the source portions 104 with which it's in contact. In some embodiments, connection layer 108 may partially or fully cover source portions 104 to which it's in contact with. As shown in FIGS. 1A-1C, connection layer 108 may be over two adjacent source portions 104 and the support structure 120 between the two adjacent source portions 104. For example, connection layer 108 may partially or fully cover two adjacent source portions 104 and the support structure 120 between the two adjacent source portions 104. The portion of connection layer 108 in contact with and conductively connected to source portion 104 may be referred to as a first portion 108-1 of connection layer 108. The portion of connection layer 108 in contact with support structure 120 may be referred to as a second portion 108-2 of connection layer 108. In some embodiments, second portion 108-2 of connection layer 108 may be in contact with and conductively connected to a pair of first portions 108-1, e.g., adjacent first portions 108-1 on both sides of second portion 108-2 along the x-direction. In some embodiments, connection layer 108 may include a plurality of first portions 108-1 and a plurality of second portions 108-2 in contact with and conductively connected to one another along the x-direction. In some embodiments, top surfaces of second portions 108-2 of connection layer 108 may be higher than top surfaces of first portions 108-1 of connection layer 108.

In some embodiments, connection layer 108 may include more than one segment, each including at least one second portion 108-2 and a plurality of first portions 108-1 in contact with one another. Each segment may be over and in contact with one or more pairs of adjacent source portions 104 of the source structure. For example, the one or more pairs of adjacent source portions 104, connected to different segments of connection layer 108, may be separated by one or more source portions 104 that are not in contact with connection layer 108. The specific number of segments in connection layer 108 should be determined based on the design and/or fabrication of 3D memory device 100 and should not be limited by the embodiments of the present disclosure. In some embodiments, connection layer 108 may be over and in contact with all source portions 104 in the respective source structure. A source voltage may be applied on second portions 108-2 of the source structure so the all source portions 104 connected to connection layer 108 can be applied with the source voltage.

In some embodiments, a width of connection layer 108 (or its segments, if any) along the y-direction may vary, depending on the design and/or fabrication process of 3D memory device 100. In some embodiments, connection layer 108 may partially cover the source portions 104 underneath. That is, the width of connection layer 108 along the y-direction is equal to or less than the width of the source structure along the y-direction. In some embodiments, dielectric cap layer 115 may cover first portions 108-1 of connection layer 108 and expose second portions 108-2 of connection layer. A width d1 of second portion 108-2 of connection layer 108 may be less than or equal to a width d2 of dielectric cap layer 115 along the y-direction. In some embodiments, width d1 is less than width d2 so dielectric cap layer 115 can insulate second portion 108-2 from surroundings structures and/or devices along lateral directions (e.g., in the x-y plane). In some embodiments, conductive plugs (now shown, for applying a source voltage on connection layer 108) are formed on second portions 108-2. In some embodiments, dielectric cap layer 115 may be partially located in block regions 21. In some embodiments, dielectric cap layer 115 covers all channel structures 110 in block region 21. Contact plugs (not shown) for conductively applying a drain voltage can subsequently be formed extending through dielectric cap layer 115 and form contact with channel structures 110.

In some embodiments, spacer layer 125 includes one or more of silicon oxide, silicon nitride, and/or silicon oxynitride. In some embodiments, conductor portions 123 include the same material as conductor layers 133 in adjacent block regions 21, and insulating portions 124 include the same material as insulating layers 134 in adjacent block regions 21. For example, conductor portions 123 may include one or more of tungsten, aluminum, cobalt, copper, polysilicon, and silicides, and insulating portions 124 may include one or more of silicon oxide, silicon nitride, and silicon oxynitride. In some embodiments, connection layer 108 includes one or more of tungsten, aluminum, cobalt, copper, polysilicon, and silicides. In some embodiments, source portion 104 includes polysilicon, and connection layer 108 includes tungsten. In some embodiments, dielectric cap layer 115 includes silicon oxide. In some embodiments, 3D memory device 100 includes an adhesion layer (not shown), e.g., TiN, between source portion 104 (or the source contact of source portion 104) and connection layer 108 to improve the adhesion and/or conductivity between source portion 104 and connection layer 108. In some embodiments, 3D memory device 100 includes another adhesion layer (not shown), e.g., TiN, between the respective insulating structure of source portion 104 and support structure 120 (e.g., spacer layer 125) to improve the adhesion between the insulating structure and support structure 120.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 8A:
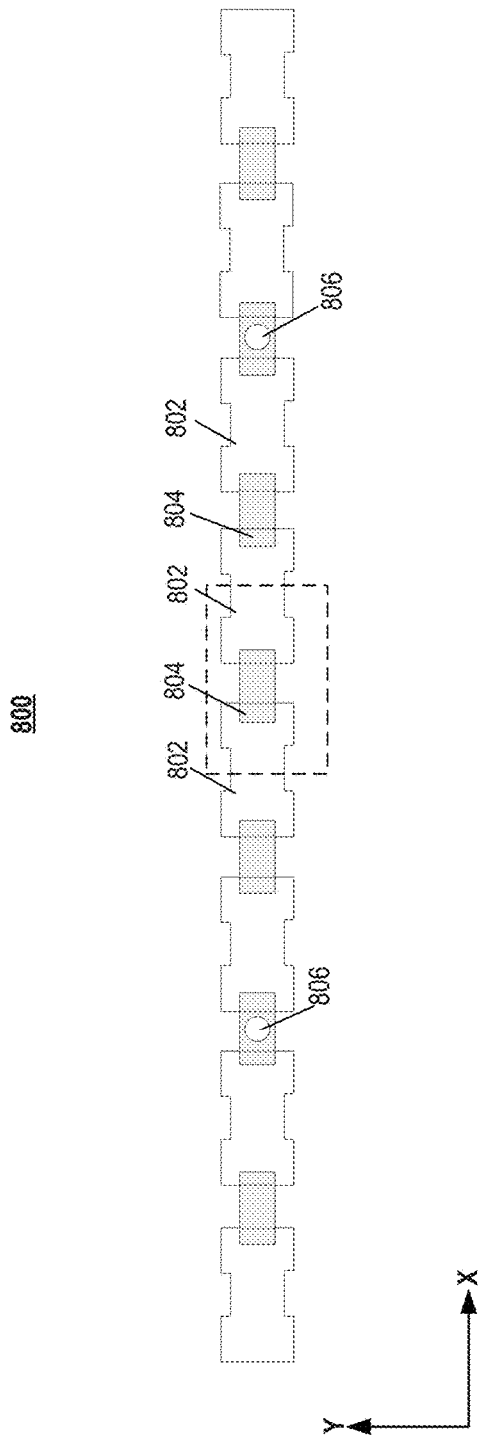
FIG. 8A illustrates a plan view of an exemplary pattern set for forming various structures in a fabrication process for forming a 3D memory device, according to some embodiments of the present disclosure.
Figure 8B:
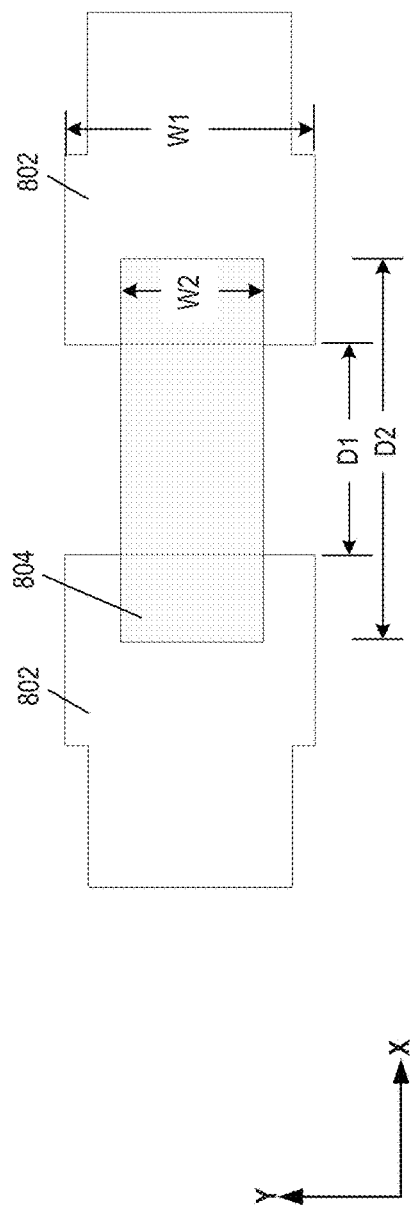
FIG. 8B illustrates an enlarged view of a portion of the pattern set shown in FIG. 8A, according to some embodiments of the present disclosure.

FIG. 8A illustrates an exemplary pattern set 800 for forming the etch masks used in the fabrication process. FIG. 8B illustrates an enlarged view of a unit 850 of the pattern set. Patterns in pattern set 800 may be used in different stages of a fabrication process to form 3D memory device 100. In various embodiments, depending on the types of photoresist used in the patterning processes, patterns in pattern set 800 may each be a part of an etch mask or a pattern for determining an etch mask. For example, if a negative photoresist is used for patterning, the patterns in pattern set 800 may be used as parts of etch masks; if a positive photoresist is used for patterning, the patterns in pattern set 8700 may be complementary patterns for determining the etch masks. It should be noted that the shapes, dimensions, and ratios shown in FIGS. 8A and 8B are for illustrative purposes and are not to scale.

As shown in FIG. 8A, pattern set 800 includes patterns 802, 804, and 806. Specifically, pattern 802 may be used for patterning slit openings of a slit structure, in which a source structure is formed. Pattern 804 may be used for patterning connection layer 108, or the second portion(s) of connection layer 108. Pattern 806 may be used for forming contact plugs in contact with and conductively connected to connection layer 108 and a peripheral circuit. Pattern set 800 may include a plurality of repeating units, e.g., 850, for the formation of support structure 120, the slit openings, and connection layer 108. The actual dimensions of patterns 802, 804, and 806 may be determined based on the fabrication processes and should not be limited by the embodiments of the present disclosure.

FIG. 8B illustrates a repeating unit 850 that shows the details, e.g., coverage, of each pattern. In some embodiments, an etch mask corresponding to pattern 802 is used to form the slit openings and support structures 120. A width W1 of pattern 802 may be nominally equal to a lateral dimension of the respective slit opening and support structure 120 along the y-direction. A distance D1 between adjacent portions of pattern 802 may be nominally equal to the lateral dimension of support structure 120 along the x-direction. In some embodiments, an etch mask corresponding to pattern 804 is used to form second portion 108-2 of connection layer. A length D2 of pattern 804 along the x-direction may be nominally equal to the lateral dimension of second portion 108-2 of connection layer along the x-direction, and a width W2 of pattern 804 along the y-direction may be nominally equal to the lateral dimension of second portion 108-2 of connection layer along the y-direction. Length D2 may be equal to or greater than distance D1 so second portion 108-2 of connection layer can be in contact with first portion 108-1 over the adjacent source portions 104. In some embodiments, W2<W1, and D1<D2. The sequence to apply the patterns may be described in the fabrication process for forming 3D memory device 100 below.

Figure 10A:
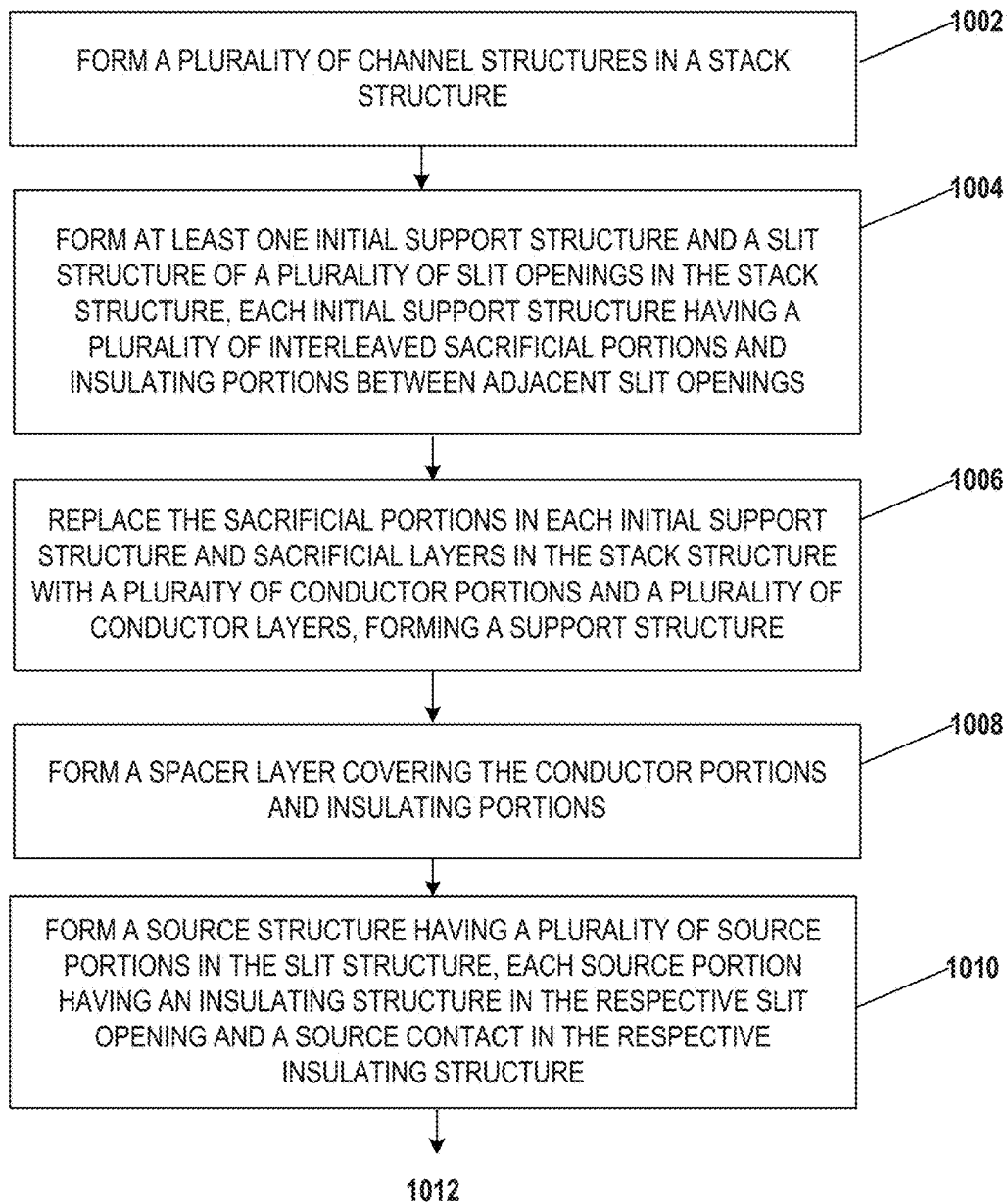
FIGS. 10A and 10B illustrate a flowchart of an exemplary fabrication process for forming a 3D memory device having source structures of reduced resistance and improved support, according to some embodiments of the present disclosure.
Figure 10B:
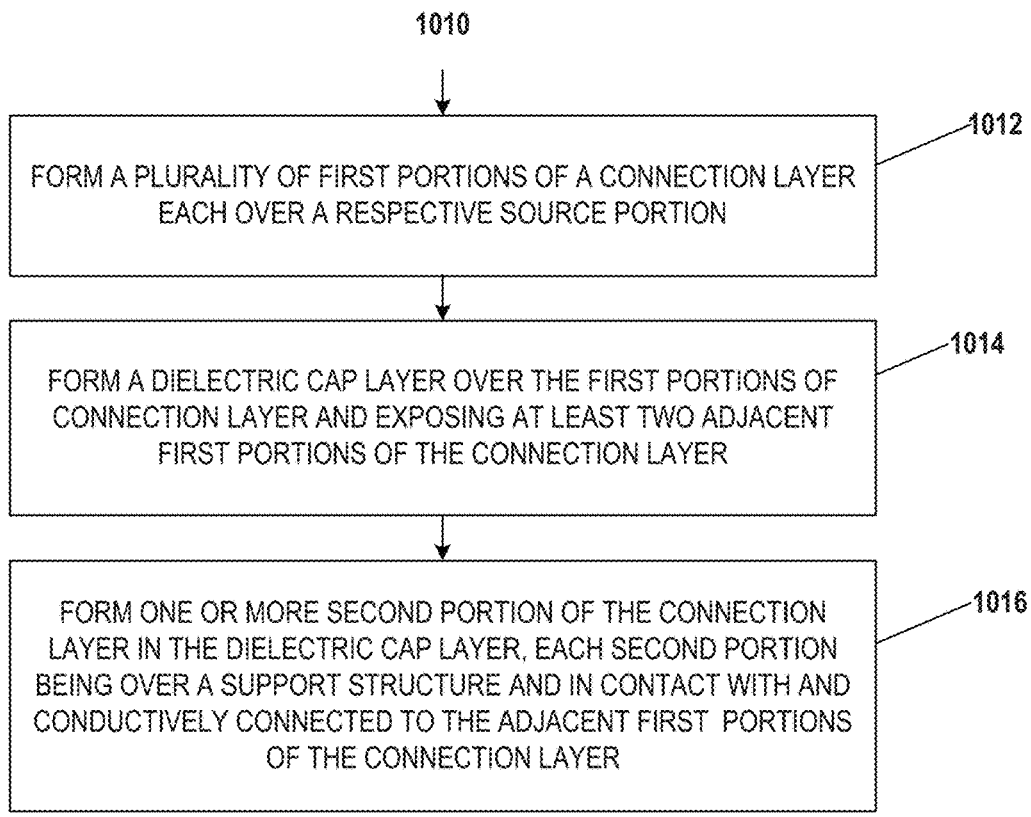

FIGS. 2-7 illustrate a fabrication process to form 3D memory device 100, and FIGS. 10A and 10B illustrate a flowchart 1000 of the fabrication process, according to some embodiments. FIG. 10B is a continuation of FIG. 10A. For ease of illustration, FIGS. 8A and 8B are illustrated together with FIGS. 2-7 to describe the fabrication process.

Figure 2A:
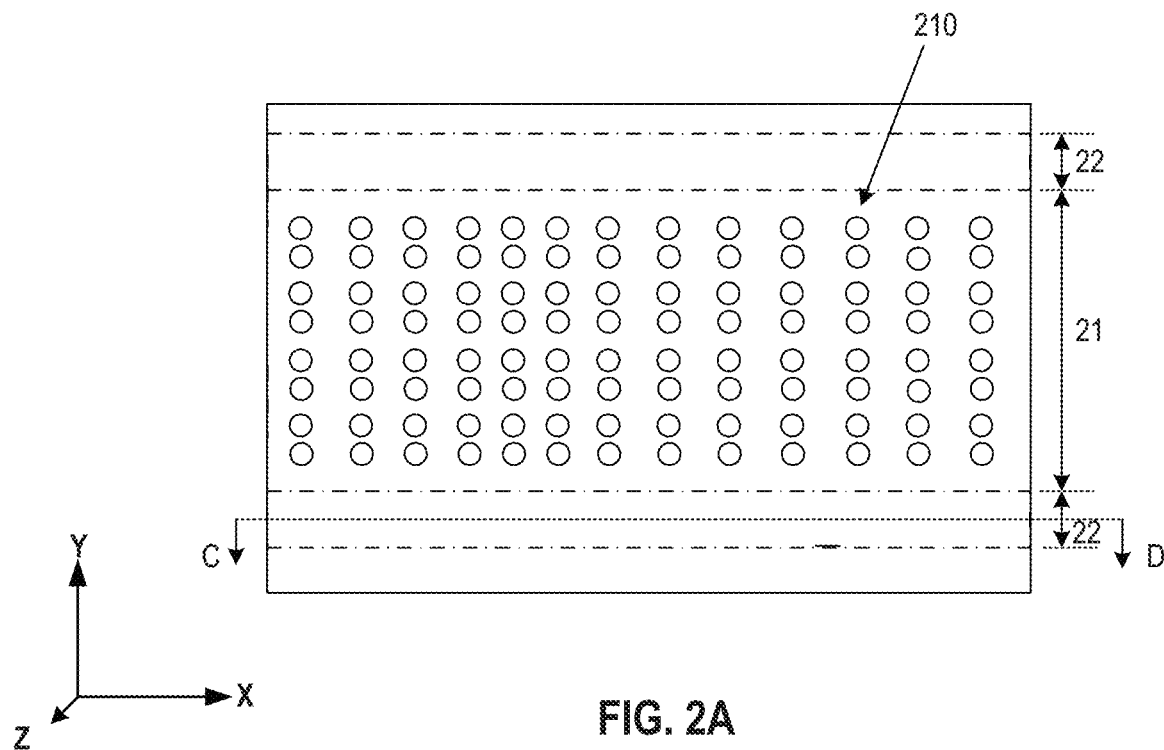
FIG. 2A illustrates a plan view of an exemplary 3D memory device at one stage of a fabrication process, according to some embodiments of the present disclosure.
Figure 2B:
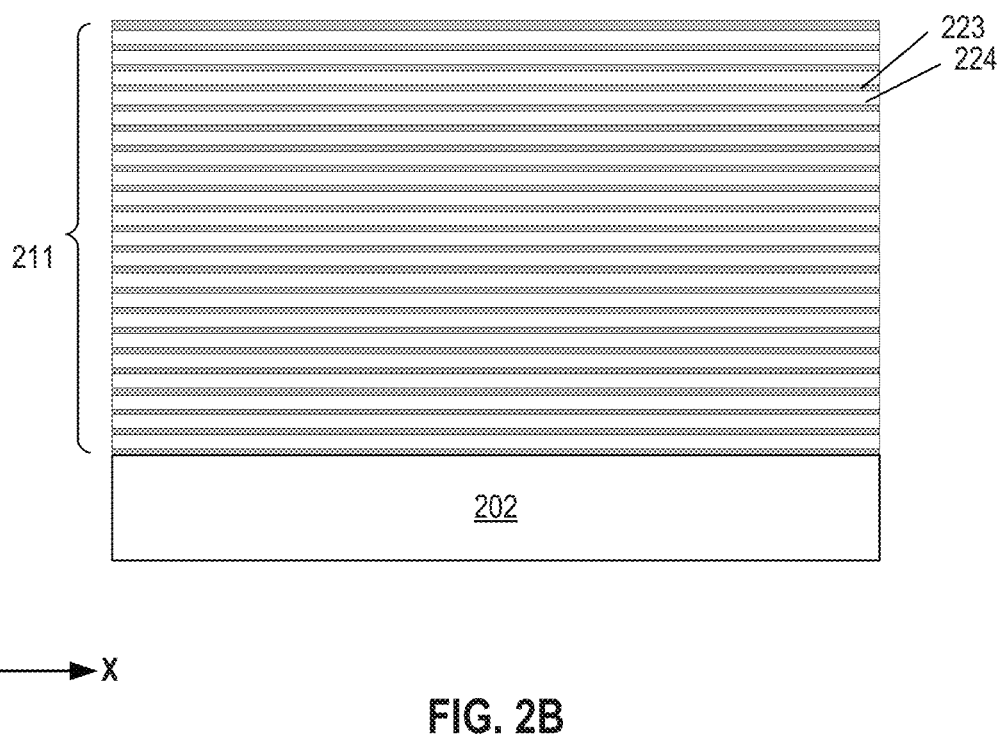
FIG. 2B illustrates a cross-sectional view of the 3D memory device illustrated in FIG. 2A along the C-D direction, according to some embodiments of the present disclosure.

At the beginning of the process, at operation 1002, a plurality of channel structures are formed in a stack structure. FIGS. 2A and 2B illustrate a corresponding structure.

As shown in FIGS. 2A and 2B, a plurality of channel structures 210 are formed in a stack structure 211. Stack structure 211 may have a dielectric stack of interleaved sacrificial material layers 223 and insulating material layers 224 formed over a substrate 102. Sacrificial material layers 223 may be used for subsequent formation of conductor layers and conductor portions. Insulating material layers 224 may be used for subsequent formation of insulating layers and insulating portions. In some embodiments, stack structure 211 includes a first dielectric cap layer (not shown) on the top surface of stack structure 211. 3D memory device 100 may include a channel region for forming channel structures 210. The channel region may include a plurality of source regions 22 and a block region 21 between adjacent source regions 22.

Stack structure 211 may have a staircase structure. The staircase structure can be formed by repetitively etching a material stack that includes a plurality of interleaved sacrificial material layers and insulating material layers using an etch mask, e.g., a patterned PR layer over the material stack. The interleaved sacrificial material layers and the insulating material layers can be formed by alternatingly depositing layers of sacrificial material and layers of insulating material over substrate 102 until a desired number of layers is reached. The sacrificial material layers and insulating material layers can have the same or different thicknesses. In some embodiments, a sacrificial material layer and the underlying insulating material layer are referred to as a dielectric pair. In some embodiments, one or more dielectric pairs can form one level/staircase. During the formation of the staircase structure, the PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the sacrificial material layer and the underlying insulating material layer. The etched sacrificial material layers and insulating material layers may form sacrificial material layers 223 and insulating material layers 224. The PR layer can then be removed.

The insulating material layers and sacrificial material layers may have different etching selectivities during the subsequent gate-replacement process. In some embodiments, the insulating material layers and the sacrificial material layers include different materials. In some embodiments, the insulating material layers include silicon oxide, and the deposition of insulating material layers include one or more of chemical vapor deposition (CVD), atomic layer deposition (ALD), and physical vapor deposition (PVD). In some embodiments, the sacrificial material layers include silicon nitride, and the deposition of insulating material layers include one or more of CVD, PVD, and ALD. In some embodiments, the etching of the sacrificial material layers and the insulating material layers include one or more suitable etching process, e.g., dry etch and/or wet etch.

A plurality of channel structures 210 can be formed in block region 21 before or after the formation of the support structures. For illustrative purposes, in embodiments of the present disclosure, channel structures 210 are formed prior to the support structures. To form channel structures 210, a plurality of channel holes may be formed extending vertically through stack structure 211. In some embodiments, a plurality of channel holes are formed through the interleaved sacrificial material layers 223 and insulating material layers 224. The plurality of channel holes may be formed by performing an anisotropic etching process, using an etch mask such as a patterned PR layer, to remove portions of stack structure 211 and expose substrate 202. In some embodiments, a plurality of channel holes are formed in each block region 21. A recess region may be formed at the bottom of each channel hole to expose a top portion of substrate 202 by the same etching process that forms the channel hole above substrate 202 and/or by a separate recess etching process. In some embodiments, a semiconductor plug is formed at the bottom of each channel hole, e.g., over the recess region. The semiconductor plug may be formed by an epitaxial growth process and/or a deposition process. In some embodiments, the semiconductor plug is formed by epitaxial growth and is referred to as the epitaxial portion. Optionally, a recess etch (e.g., dry etch and/or wet etch) may be performed to remove excess semiconductor material on the sidewall of the channel hole and/or control the top surface of the epitaxial portion at a desired position. In some embodiments, the top surface of the epitaxial portion is located between the top and bottom surfaces of the bottom insulating material layer 224.

In some embodiments, the channel holes are formed by performing a suitable etching process, e.g., an anisotropic etching process (e.g., dry etch) and/or an isotropic etching process (wet etch). In some embodiments, the epitaxial portion includes single crystalline silicon is formed by epitaxially grown from substrate 202. In some embodiments, the epitaxial portion includes polysilicon formed by a deposition process. The formation of epitaxially-grown epitaxial portion can include, but not limited to, vapor-phase epitaxy (VPE), liquid-phase epitaxy (LPE), molecular-beam epitaxy (MPE), or any combinations thereof. The formation of the deposited epitaxial portion may include, but not limited by, CVD, PVD, and/or ALD.

In some embodiments, a semiconductor channel is formed over and in contact with the epitaxial portion in the channel hole. Semiconductor channel can include a channel-forming structure that has a memory film (e.g., including a blocking layer, a memory layer, and a tunneling layer), a semiconductor layer formed above and connecting the epitaxial portion, and a dielectric core filling up the rest of the channel hole. In some embodiments, memory film is first deposited to cover the sidewall of the channel hole and the top surface of the epitaxial portion, and a semiconductor layer is then deposited over memory film and above epitaxial portion. The blocking layer, memory layer, and tunneling layer can be subsequently deposited in this order using one or more thin film deposition processes, such as ALD, CVD, PVD, any other suitable processes, or any combination thereof, to form memory film. The semiconductor layer can then be deposited on the tunneling layer using one or more thin film deposition processes, such as ALD, CVD, PVD, any other suitable processes, or any combination thereof. In some embodiments, a dielectric core is filled in the remaining space of the channel hole by depositing dielectric materials after the deposition of the semiconductor layer, such as silicon oxide.

In some embodiments, a drain structure is formed in the upper portion of each channel hole. In some embodiments, parts of memory film, semiconductor layer, and dielectric core on the top surface of stack structure 211 and in the upper portion of each channel hole can be removed by CMP, grinding, wet etching, and/or dry etching to form a recess in the upper portion of the channel hole so that a top surface of semiconductor channel may be between the top surface and the bottom surface of the first dielectric cap layer. Drain structure then can be formed by depositing conductive materials, such as metals, into the recess by one or more thin film deposition processes, such as CVD, PVD, ALD, electroplating, electroless plating, or any combination thereof. A channel structure 210 is thereby formed. A plurality of memory cells may subsequently be formed by the intersection of the semiconductor channels and the control conductor layers. Optionally, a planarization process, e.g., dry/wet etch and/or CMP, is performed to remove any excess material on the top surface of stack structure 211.

Figure 3A:
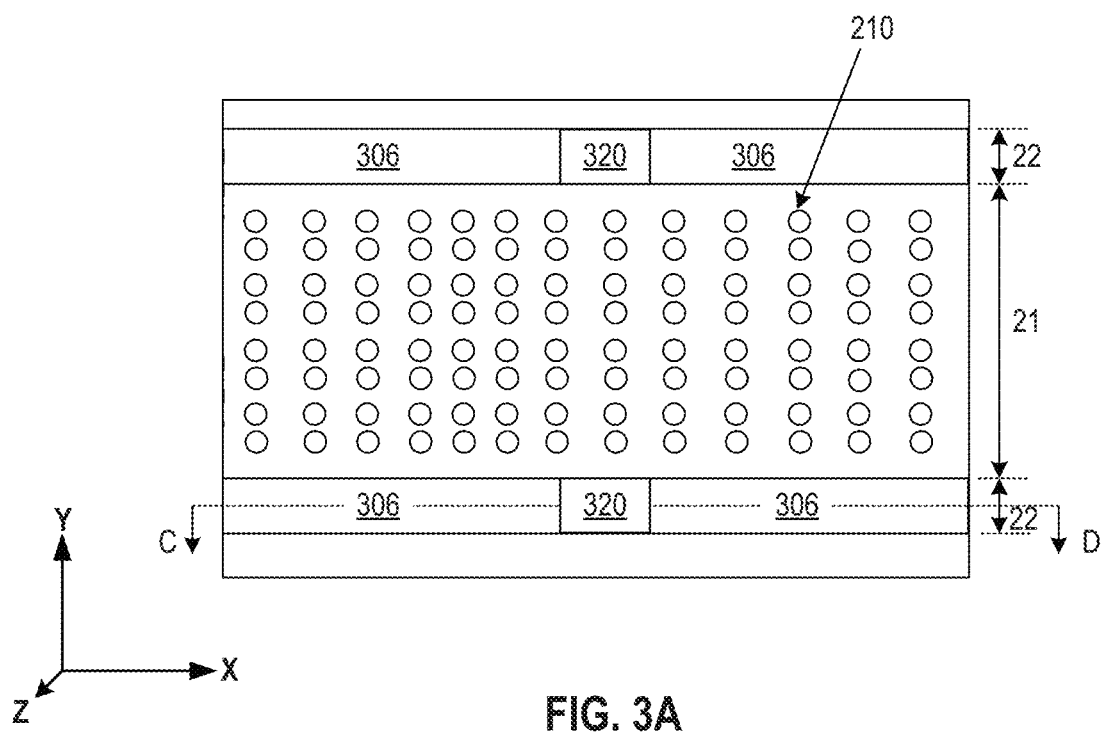
FIG. 3A illustrates a plan view of the exemplary 3D memory device at another stage of the fabrication process, according to some embodiments of the present disclosure.
Figure 3B:
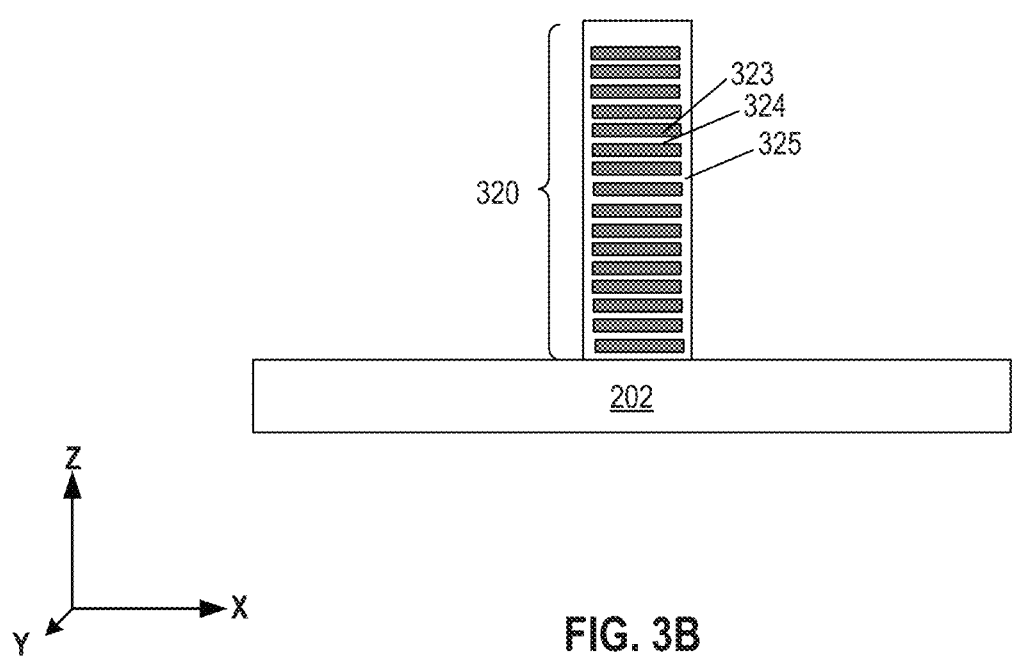
FIG. 3B illustrates a cross-sectional view of the 3D memory device illustrated in FIG. 3A along the C-D direction, according to some embodiments of the present disclosure.

Referring back to FIG. 10A, after the formation of the channel structures, method 1000 proceeds to operation 1004, in which portions of the stack structure are removed to form a slit structure and at least one initial support structure dividing the slit structure into a plurality of slit opening (Operation 1004). The at least one initial support structure each has interleaved a plurality of sacrificial portions and a plurality of insulating portions between adjacent slit openings. FIGS. 3A and 3B illustrate a corresponding structure.

As shown in FIGS. 3A and 3B, portions of stack structure 211 in source region 22, are removed to form a slit structure that has a plurality of slit openings 306, and at least one initial support structure. The slit structure may expose substrate 102. Pattern 802 may be used for patterning stack structure 211 and form the slit structure and the initial support structures. That is, portions of stack structure 211 in source region 22 are removed to form slit openings 306. The un-etched portions of stack structure 211 in source region 22 may form interleaved sacrificial portions and insulating portions 324, forming initial support structure. Sacrificial portions and insulating portions 324 may each be in contact with the sacrificial layers and insulating layers of the same level in adjacent block regions 21. In some embodiments, slit openings 306 may expose substrate 202 and interleaved sacrificial layers and insulating layers in adjacent block regions 21. In some embodiments, along the y-direction, a width of the initial support structure may nominally equal to a width of the slit structure. A suitable anisotropic etching process, e.g., dry etch, can be performed to form slit openings 306 and initial support structure.

Referring back to FIG. 10A, after the formation of the initial support structure and the slit structure, method 1000 proceeds to operation 1006, in which the sacrificial portions in each initial support structure and the sacrificial layers in each block region are replaced with conductor portions and conductor layers, forming at least one support structure and a plurality of memory blocks. FIGS. 3A and 3B illustrate a corresponding structure.

As shown in FIGS. 3A and 3B, the sacrificial portions in each initial support structure are replaced with a plurality of conductor portions 323. The sacrificial layers in each block region 21 are replaced with a plurality of conductor layers (referring back to conductor layers 133 FIG. 1C). An isotropic etching process, e.g., wet etch, can be performed to remove the sacrificial portions and sacrificial layers through the slit structures (or slit openings 306). A plurality of lateral recesses may be formed in each block region 21 by the removal of the sacrificial layers, and a plurality of recess portions may be formed in each initial support structure by the removal of the sacrificial portions. A conductor material may then be deposited to fill up the lateral recesses and recess portions, forming the plurality of conductor layers in each block region and the plurality of conductor portions 323 in each initial support structure. Accordingly, support structure 320, having interleaved conductor portions 323 and insulating portions 324, may be formed.

Referring back to FIG. 10A, after the formation of the conductor portions and conductor layers, optionally, method 1000 proceeds to operation 1008, in which a spacer layer is formed over the interleaved conductor portions and insulating portions. FIGS. 3A and 3B illustrate a corresponding structure.

In some embodiments, a spacer layer 325 is formed to surround interleaved conductor portions 323 and insulating portions 324. Spacer layer 325 may cover interleaved conductor portions 323 and insulating portions 324 on the top surface and on the side surfaces that are in contact with slit openings 306. In some embodiments, spacer layer 325 is deposited by at least one of CVD, PVD, and ALD. In some embodiments, spacer layer 325 undergoes a recess etch such that spacer layer 325 has desired a thickness.

Figure 4A:
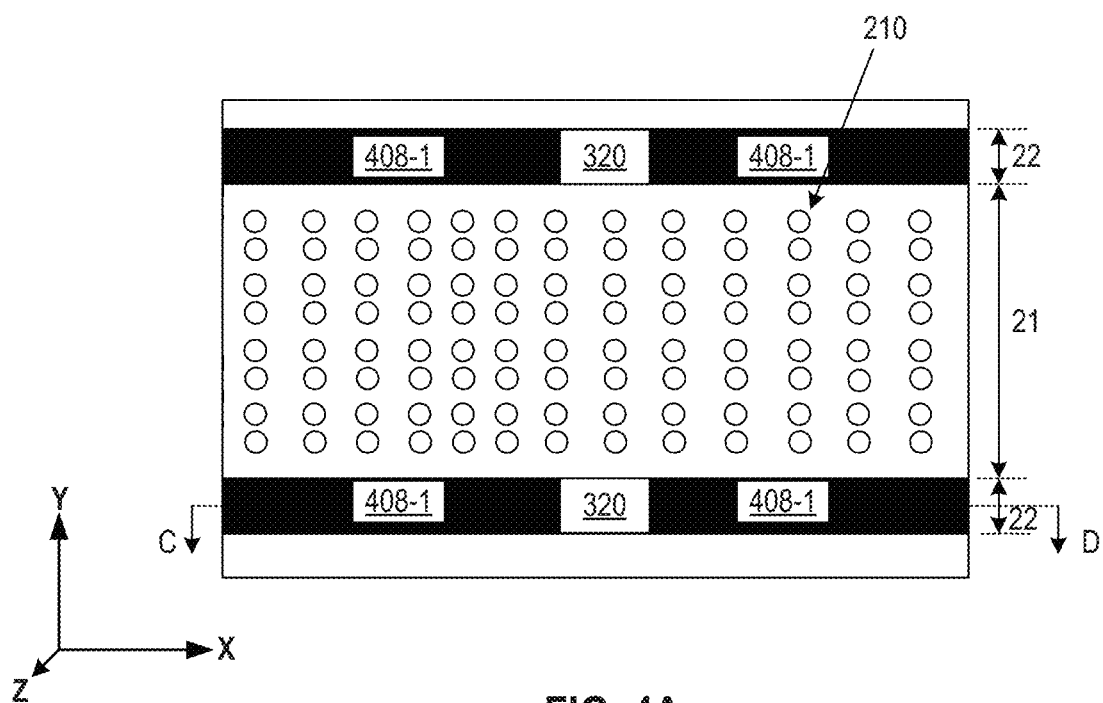
FIG. 4A illustrates a plan view of the exemplary 3D memory device at another stage of the fabrication process, according to some embodiments of the present disclosure.
Figure 4B:
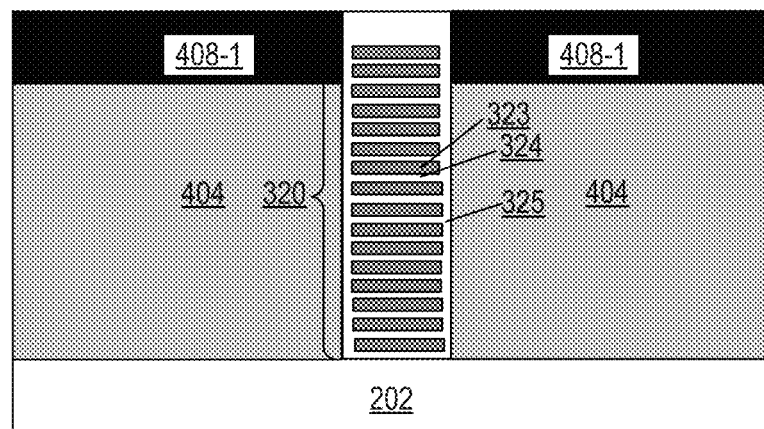
FIG. 4B illustrates a cross-sectional view of the 3D memory device illustrated in FIG. 4A along the C-D direction, according to some embodiments of the present disclosure.

Referring back to FIG. 10A, after the formation of the support structure, method 1000 proceeds to operation 1010, in which a source structure having a plurality of source portions are each formed in a respective slit opening of the slit structure. FIGS. 4A and 4B illustrate a corresponding structure.

As shown in FIGS. 4A and 4B, a source structure is formed in the slit structure. The source structure may include a plurality of source portions 404, each having an insulating structure in the respective slit opening 306 of the slit structure and a source contact in each insulating structure. Optionally, an adhesion layer (not shown) is deposited over the top surface and/or sidewalls of support structure 320 before the formation of the source structure. In some embodiments, the insulating structure includes silicon oxide and the source contacts include polysilicon. The insulating structure and source contacts may each be deposited by one or more of CVD, PVD, ALD, and sputtering. A recess etching process may be performed on the insulating structure to expose substrate 202 so the respective source contact can be in contact with substrate 202. In some embodiments, the adhesion layer includes TiN and is deposited by one or more of CVD, PVD, ALD, and electroplating. In some embodiments, top surfaces of source portions 104 may be lower than a top surface of support structure 320. Optionally, a recess etching process may be performed to etch back source portions 404 to form sufficient space in slit openings 306 for the formation of the connection layer.

Referring back to FIG. 10B, after the formation of the source portions, method 1000 proceeds to operation 1012, in which a plurality of first portions of a connection layer is formed to each be over a respective source portion. FIGS. 4A and 4B illustrate a corresponding structure.

As shown in FIGS. 4A and 4B, a first portion 408-1 of connection layer 408 is deposited over a respective source portion 404 (or the source contact of source portion 404). First portion 408-1 may partially or fully cover the respective source portion 404. In some embodiments, first portions 408-1 of connection layer 408 fill up slit openings 306. Optionally, an adhesion layer (not shown) is deposited over the top surface of source portions 404 before the formation of first portion 408-1 of connection layer 408. In some embodiments, first portions 408-1 of connection layer 408 includes a conductive material that includes one or more of tungsten, aluminum, copper, cobalt, polysilicon, and silicides. In some embodiments, source portions 404 includes polysilicon and first portions 408-1 of connection layer 408 include tungsten. Optionally, a planarization process, e.g., CMP and/or recess etch, is performed to remove any excess material over first portions 408-1 of connection layer 408 and support structures 320. In some embodiments, the top surfaces of support structures 320 and first portions 408-1 of connection layer 408 may be coplanar in the x-y plane.

Referring back to FIG. 10B, after the formation of the first portions of the connection layer, method 1000 proceeds to operation 1014, in which a dielectric cap layer is formed over the first portions of the connection layer and exposing at least two adjacent first portions of the connection layer. FIGS. 5A, 5B, 6A, and 6B illustrate corresponding structures.

Figure 5A:
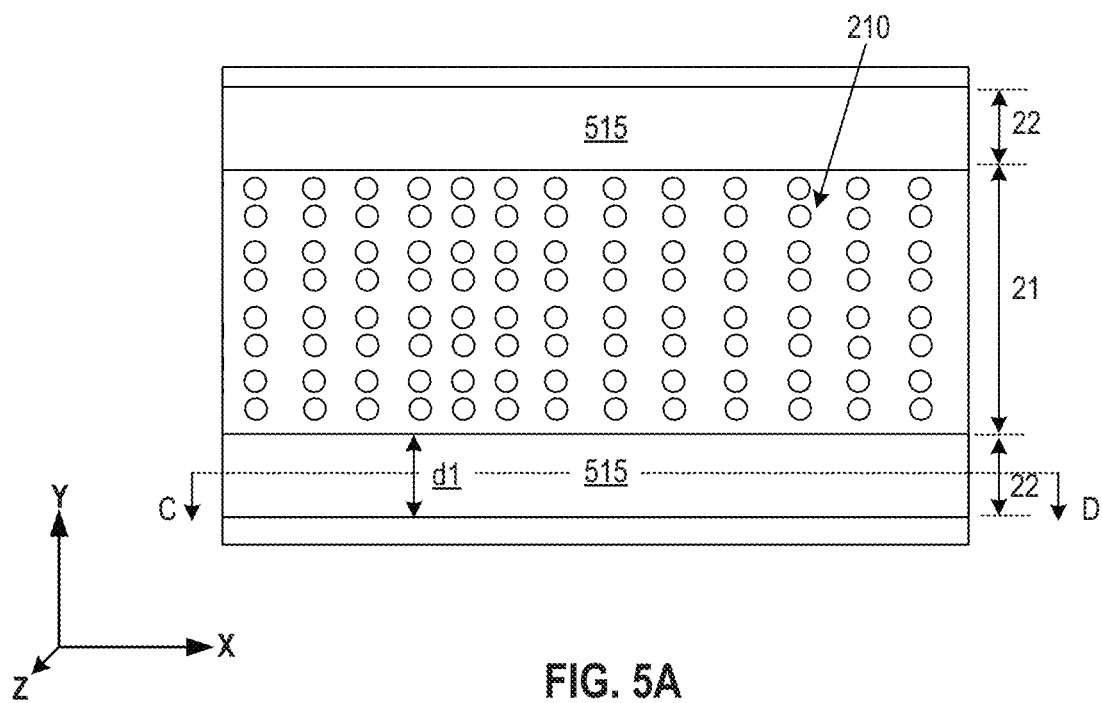
FIG. 5A illustrates a plan view of the exemplary 3D memory device at another stage of the fabrication process, according to some embodiments of the present disclosure.
Figure 5B:
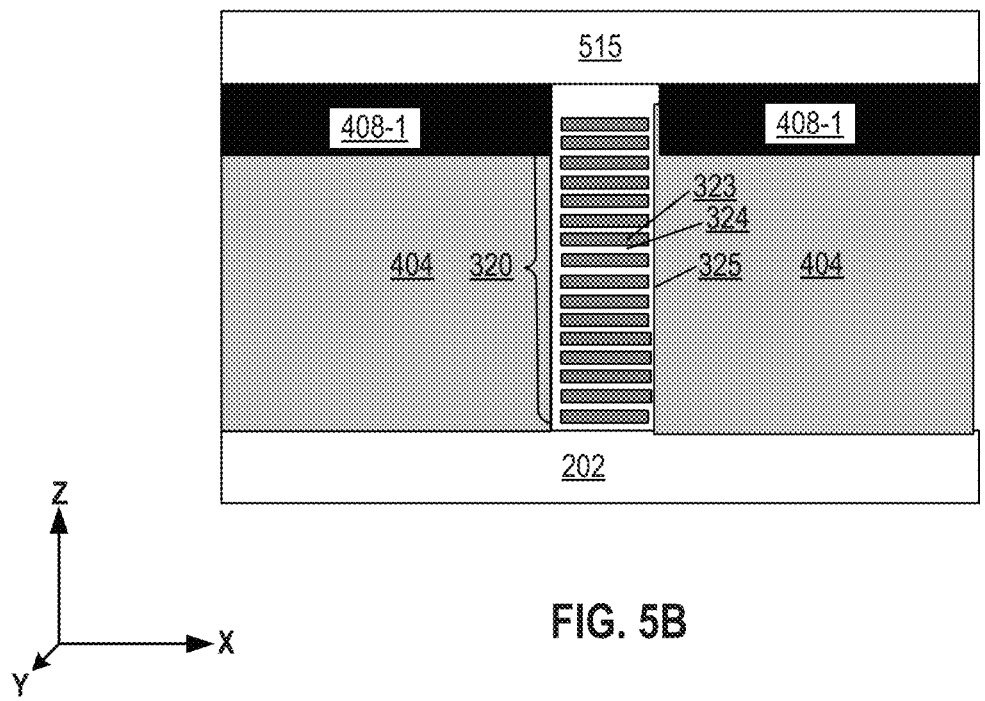
FIG. 5B illustrates a cross-sectional view of the 3D memory device illustrated in FIG. 5A along the C-D direction, according to some embodiments of the present disclosure.

As shown in FIGS. 5A and 5B, a dielectric cap layer 515 is formed over each source structure. In some embodiments, dielectric cap layer 515 covers a pair of adjacent first portions 408-1 of connection layer 408 and support structure 320 in between. In some embodiments, dielectric cap layer 515 also covers areas outside of source regions 22, such as block regions 21. The area covered by dielectric cap layer 515 may be determined based on the coverage of the subsequently-formed second portions 408-2 of connection layer 408. In some embodiments, the area covered by dielectric cap layer 515 may be greater than the area of second portions 408-2 of connection layer 408 along the x-y plane to insulate connection layer 408 from other parts of stack structure 211 except for source portions 404. Dielectric cap layer 515 may be formed by depositing a suitable dielectric material such as silicon oxide to cover first portions 408-1 and support structures 320. In some embodiments, dielectric cap layer 515 covers all channel structures 210 in block region 21. Dielectric cap layer 515 may be deposited by one or more of CVD, PVD, and ALD.

Figure 6A:
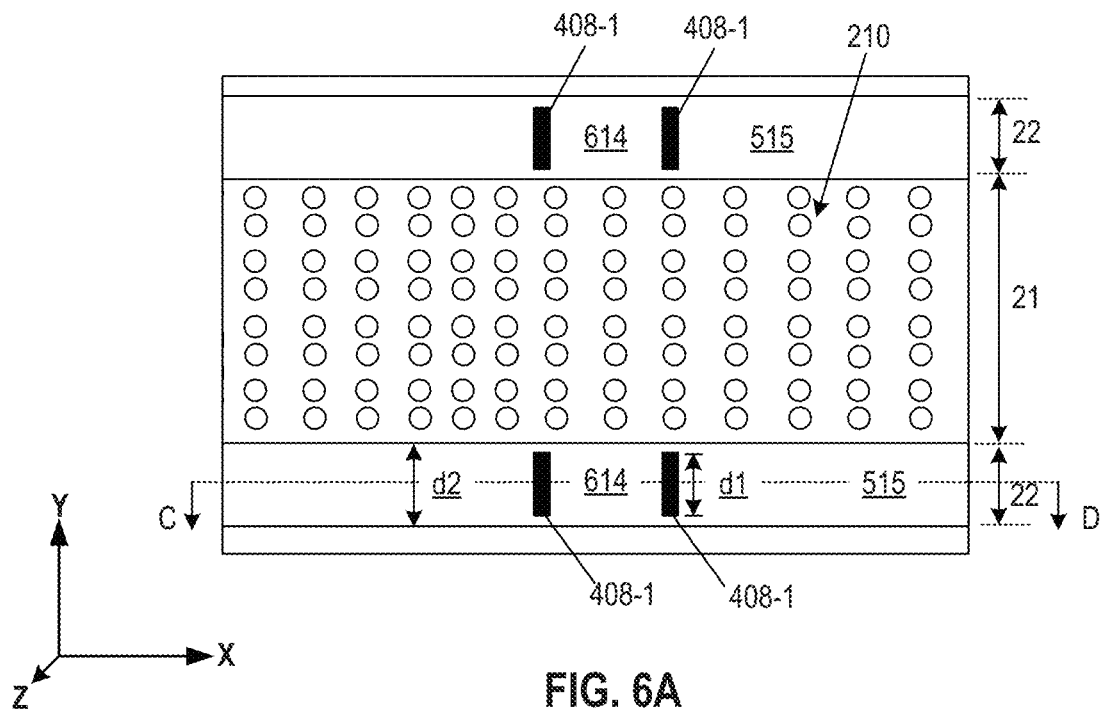
FIG. 6A illustrates a plan view of the exemplary 3D memory device at another stage of the fabrication process, according to some embodiments of the present disclosure.
Figure 6B:
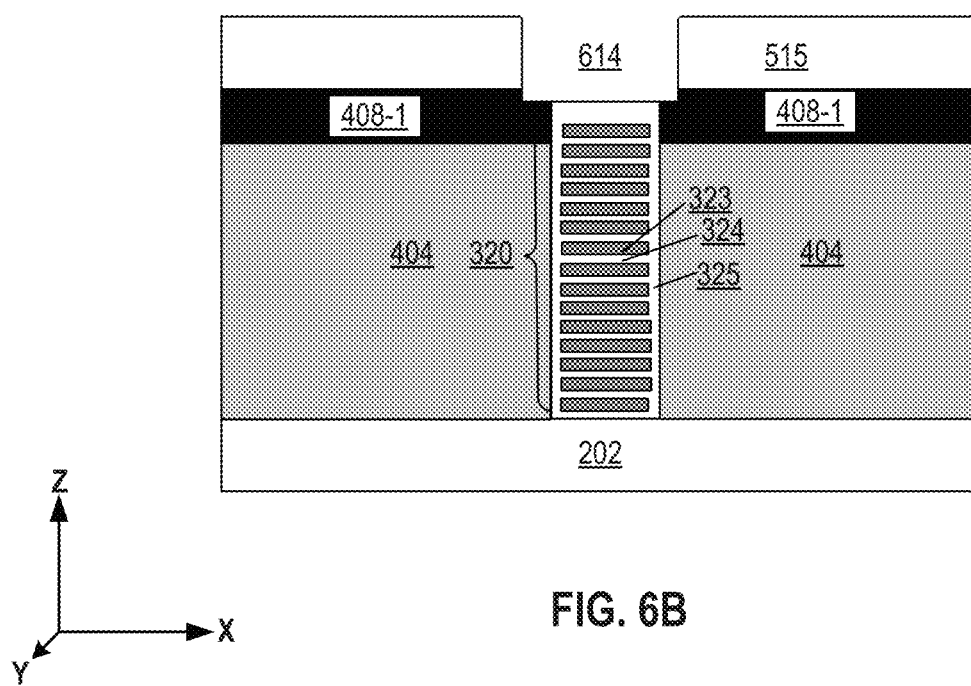
FIG. 6B illustrates a cross-sectional view of the 3D memory device illustrated in FIG. 6A along the C-D direction, according to some embodiments of the present disclosure.

As shown in FIGS. 6A and 6B, dielectric cap layer 515 is patterned to form at least one opening 614 which exposes at least a pair of two adjacent first portions 408-1 of connection layer 408. In some embodiments, opening 614 also exposes the support structure 320 between the pair of adjacent first portions 408-1. In some embodiments, support structure 320 (or the dielectric material on the top portion of support structure 320) is partially removed for the formation of opening 614. In some embodiments, dielectric cap layer 515 exposes all the support structures 320 and all pairs of adjacent first portions 408-1 of connection layer 408. Pattern 804 may be used for patterning opening 614. The formation of opening 614 may include a photolithography process and a suitable etching process, e.g., dry etch and/or wet etch. In some embodiments, along the y-direction, a width d2 of dielectric cap layer 515 is greater than a width d1 of first portions 408-1 of connection layer 408 (or the width of opening 614).

Figure 7A:
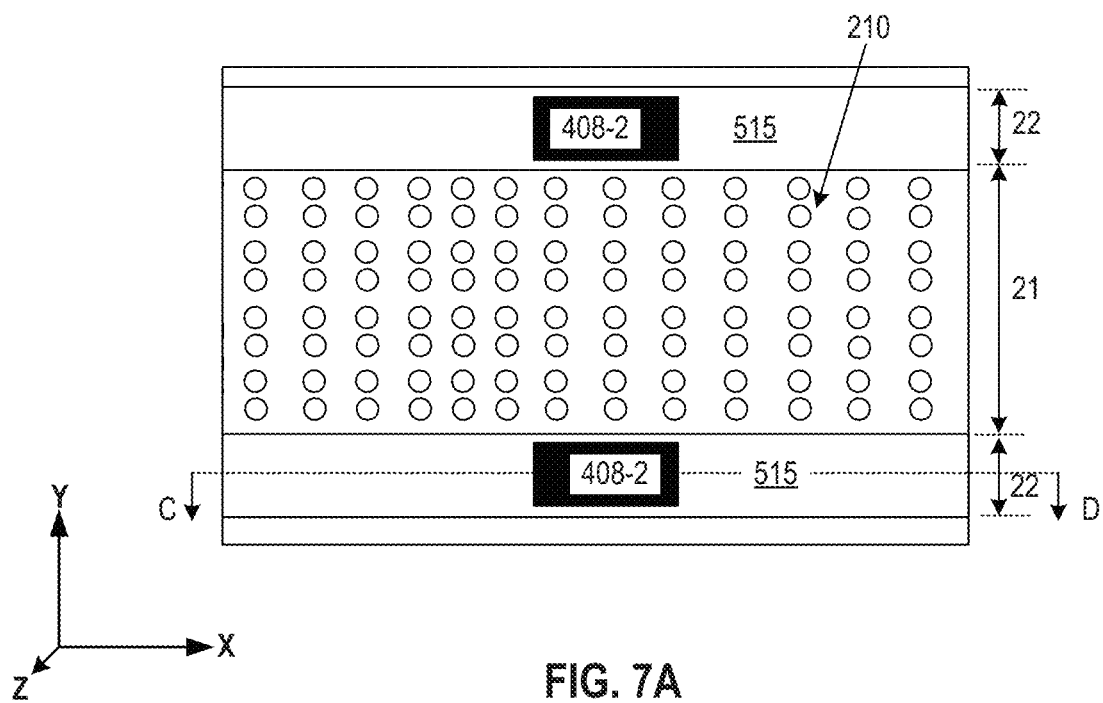
FIG. 7A illustrates a plan view of the exemplary 3D memory device at another stage of the fabrication process, according to some embodiments of the present disclosure.
Figure 7B:
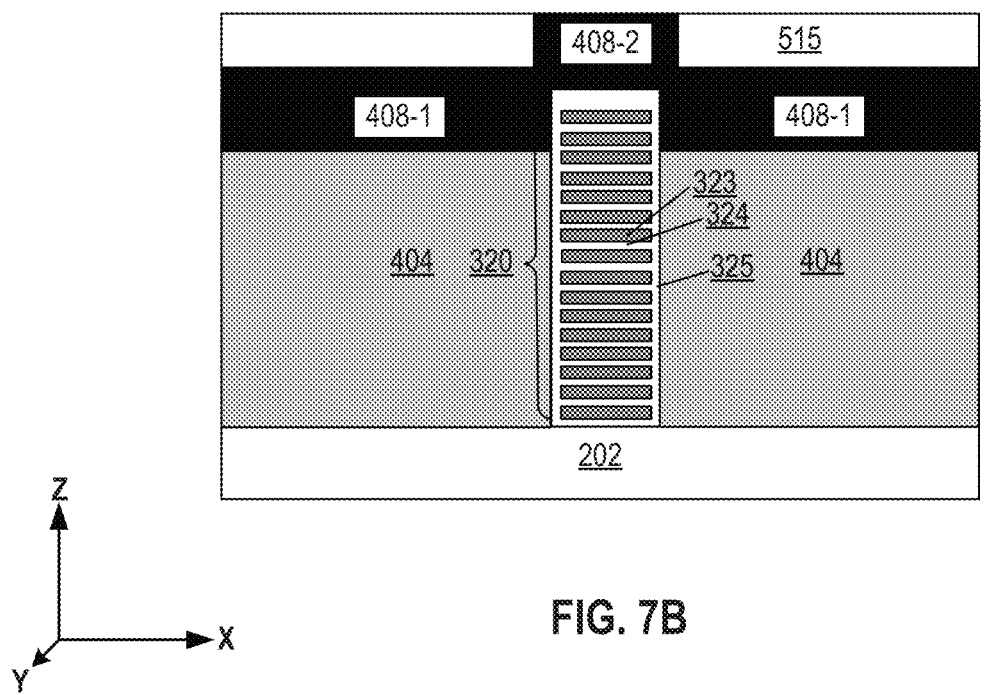
FIG. 7B illustrates a cross-sectional view of the 3D memory device illustrated in FIG. 6A along the C-D direction, according to some embodiments of the present disclosure.

Referring back to FIG. 10B, after the formation of the dielectric cap layer, method 1000 proceeds to operation 1016, in which a second portion of the connection layer is formed over a support structure and in contact with and conductively connected to a pair of adjacent first portions of the connection layer. FIGS. 7A and 7B illustrate a corresponding structure.

As shown in FIGS. 7A and 7B, a second portion 408-2 of connection layer 408 is formed in dielectric cap layer 515. Second portion 408-2 of connection layer 408 may be in contact with and conductively connected to the exposed pair of two adjacent first portions 408-1 of connection layer 408, forming connection layer 408. The pair of two adjacent first portions 408-1 of connection layer 408 may be positioned on both sides of the support structure 320 between the two adjacent first portions 408-1 of connection layer 408. In some embodiments, a plurality of second portions 408-2 of connection layer 408 are formed in a plurality of openings 614 to be in contact with and conductively connected to a plurality of pairs, e.g., all pairs, of adjacent first portions 408-1 of connection layer 408. Second portion 408-2 of connection layer 408 may be formed by depositing a suitable conductive material that fills up opening 614. The conductive material may fully or partially cover support structure 320 and the exposed portions of the pair of adjacent first portions 408-1 of connection layer 408. The conductive material may include one or more of tungsten, aluminum, copper, cobalt, polysilicon, and silicides. In some embodiments, the conductive material includes tungsten and is deposited by one or more of CVD, PVD, and ALD. Optionally, a planarization process, e.g., CMP and/or recess etch, is performed to remove any excess material over second portion 408-2 of connection layer 408.

According to the embodiments of the present disclosure, a 3D memory device includes a memory stack over a substrate, a plurality of channel structures, a source structure, and a support structure. The memory stack includes interleaved a plurality of conductor layers and a plurality of insulating layers. The plurality of channel structures extend vertically in the memory stack. The source structure includes a plurality of source portions and extending in the memory stack. The support structure is between adjacent ones of the source portions and has a plurality of interleaved conductor portions and insulating portions. A top one of the conductor portions is in contact with a top one of the conductor layers. Adjacent ones of the source portions are conductively connected to one another.

In some embodiments, the source structure further includes a connection layer in contact with and conductively connected to the adjacent ones of the source portions, the connection layer being a conductive layer.

In some embodiments, the connection layer includes at least one of tungsten, cobalt, aluminum, copper, silicides, or polysilicon.

In some embodiments, the connection layer is positioned over each of the adjacent ones of the source portions.

In some embodiments, the connection layer is over the support structure.

In some embodiments, the support structure is in contact with memory blocks adjacent to the source structure.

In some embodiments, each of the conductor portions is in contact with conductor layers of the same level in the memory blocks and each of the insulating portions is in contact with insulating layers of the same level in the memory blocks.

In some embodiments, the conductor portions and the conductor layers include the same materials, and the insulating portions and the insulating layers include the same materials.

In some embodiments, the top one of the conductor portions of the support structure is higher than top surfaces of the adjacent ones of the source portions.

In some embodiments, the 3D memory device further includes a cap layer over the source structure. The cap layer covers a pair of first portions of the connection layer that are over the adjacent ones of the source portions and exposes a second portion of the connection layer that is over the support structure.

In some embodiments, a top surface of the second portion of the connection layer is higher than top surfaces of the pair of first portions of the connection layer.

In some embodiments, the connection layer is over and in contact with each of the plurality of source contacts.

In some embodiments, along a lateral direction perpendicular to another lateral direction along which the source structure extends, a width of the connection layer is equal to or less than a width of the source structure.

In some embodiments, the support structure includes a spacer layer in contact with and surrounding the interleaved plurality of conductor portions and insulating portions.

In some embodiments, the 3D memory device further includes an adhesion layer between each of the source portions and the adjacent support structure, and between the source portion and the connection layer in contact with the source portion.

In some embodiments, the adhesion layer includes titanium nitride.

According to embodiments of the present disclosure, a 3D memory device includes a memory stack, a plurality of channel structures, a source structure, and a support structure. The memory stack has a plurality of memory blocks over a substrate, each of the memory blocks having interleaved a plurality of conductor layers and a plurality of insulating layers. The plurality of channel structures extend vertically in the memory blocks. The source structure extend between adjacent memory blocks. The support structure is in contact with the source structure and having a plurality of interleaved conductor portions and insulating portions. Adjacent memory blocks are in contact with each other through the support structure. A top one of the conductor portions is in contact with a top one of the conductor layers in each of the adjacent memory blocks.

In some embodiments, the source structure includes a plurality of source portions, adjacent ones of the source portions are conductively connected to one another.

In some embodiments, the source structure further includes a connection layer in contact with and conductively connected to the adjacent ones of the source portions, the connection layer being a conductive layer.

In some embodiments, the connection layer includes at least one of tungsten, cobalt, aluminum, copper, silicides, or polysilicon.

The 3D memory device of claim 19 or 20, wherein the connection layer is positioned over each of the adjacent ones of the source portions and the support structure.

In some embodiments, each of the conductor portions is in contact with conductor layers of the same level in the adjacent memory blocks and each of the insulating portions is in contact with insulating layers of the same level in the adjacent memory blocks.

In some embodiments, the conductor portions and the conductor layers include the same materials, and the insulating portions and the insulating layers include the same materials.

In some embodiments, the top one of the conductor portions of the support structure is higher than top surfaces of the adjacent ones of the source portions.

In some embodiments, the 3D memory device further includes a cap layer over the source structure. The cap layer covers a pair of first portions of the connection layer that are over the adjacent ones of the source portions and exposes a second portion of the connection layer that is over the support structure.

In some embodiments, a top surface of the second portion of the connection layer is higher than top surfaces of the pair of first portions of the connection layer.

In some embodiments, the connection layer is over and in contact with each of the plurality of source contacts.

In some embodiments, along a lateral direction perpendicular to another lateral direction along which the source structure extends, a width of the connection layer is equal to or less than a width of the source structure.

In some embodiments, the support structure includes a spacer layer in contact with and surrounding the interleaved plurality of conductor portions and insulating portions.

In some embodiments, the 3D memory device further includes an adhesion layer between each of the source portions and the adjacent support structure, and between the source portion and the connection layer in contact with the source portion.

In some embodiments, the adhesion layer includes titanium nitride.

According to embodiments of the present disclosure, a method for forming a 3D memory device includes the following operations. First, a slit structure and a support structure are formed in a stack structure having interleaved a plurality of sacrificial material layers and a plurality of insulating material layers, the initial support structure between adjacent slit openings of the slit structure. A source structure is formed to include a source portion in each of the slit openings. A pair of first portions of a connection layer is formed in contact with and conductively connected to the source portion. A second portion of the connection layer is formed in contact with and conductively to the pair of first portions of the connection layer.

In some embodiments, forming the slit structure and the support structure include removing portions of the stack structure to form a plurality of slit openings and an initial support structure between adjacent ones of the slit openings, and forming a plurality of conductor portions in the initial support structure through the slit structure.

In some embodiments, forming the plurality of conductor portions includes removing, through the plurality of slit openings, the plurality of sacrificial portions in the initial support structure to form a plurality of recess portions. In some embodiments, forming the plurality of conductor portions also includes depositing a conductor material to fill up the plurality of recess portions to form the plurality of conductor portions.

In some embodiments, the method further includes forming a plurality of conductor layers in a memory block in the stack structure in the same operations that form the plurality of conductor portions. The plurality of conductor layers are formed by removing, through the plurality of slit openings, a plurality of sacrificial layers in the block to form a plurality of lateral recesses. The plurality of conductor layers are also formed by depositing the conductor material to fill up the plurality of lateral recesses to form the plurality of conductor layers.

In some embodiments, forming the support structure further includes forming a spacer layer over the conductor portions and the insulating portions.

In some embodiments, the method further includes forming a cap layer over the pair of first portions of the connection layer, forming an opening in the cap layer to expose the pair of first portions of the connection layer, and forming the second portion in the opening to be in contact with and conductively connected to the pair of first portions.

In some embodiments, the method further includes exposing the support structure in the opening such that the second portion of the connection layer is over the support structure.

In some embodiments, forming the pair of first portions of the connection layer includes depositing a conductive material over the source portions. In some embodiments, forming the second portion of the connection layers includes depositing the conductive material to fill up the opening in the cap layer.

In some embodiments, the method further includes depositing an adhesion layer between the pairs of first portions of the connection layer and the cap layer.

In some embodiments, forming the source structure includes depositing at least one of cobalt, aluminum, copper, silicides, or polysilicon in the slit openings.

In some embodiments, the method further includes depositing another adhesion layer between the source structure and the support structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack over a substrate, the memory stack comprising interleaved a plurality of conductor layers and a plurality of insulating layers;
a plurality of channel structures extending vertically in the memory stack;
a source structure comprising a plurality of source portions and extending in the memory stack; and
a support structure between adjacent ones of the source portions and comprising a plurality of interleaved conductor portions and insulating portions, wherein
a top one of the conductor portions is in contact with and conductively connected to a top one of the conductor layers, and adjacent ones of the source portions are conductively connected to one another.

2. The 3D memory device of claim 1, wherein the source structure further comprises a connection layer in contact with and conductively connected to the adjacent ones of the source portions, the connection layer being a conductive layer.

3. The 3D memory device of claim 2, wherein the connection layer comprises at least one of tungsten, cobalt, aluminum, copper, silicides, or polysilicon.

4. The 3D memory device of claim 2, wherein the connection layer is positioned over each of the adjacent ones of the source portions.

5. The 3D memory device of claim 4, wherein the connection layer is over the support structure.

6. The 3D memory device of claim 4, wherein the support structure is in contact with memory blocks adjacent to the source structure.

7. The 3D memory device of claim 6, wherein
each of the conductor portions is in contact with conductor layers of a same level in the memory blocks and each of the insulating portions is in contact with insulating layers of the same level in the memory blocks; and
the conductor portions and the conductor layers comprise the same materials, and the insulating portions and the insulating layers comprise the same materials.

8. The 3D memory device of claim 1, wherein
the top one of the conductor portions of the support structure is higher than top surfaces of the adjacent ones of the source portions.

9. The 3D memory device of claim 2, further comprising a cap layer over the source structure, wherein:
the cap layer covers a pair of first portions of the connection layer that are over the adjacent ones of the source portions and exposes a second portion of the connection layer that is over the support structure; and
a top surface of the second portion of the connection layer is higher than top surfaces of the pair of first portions of the connection layer.

10. The 3D memory device of claim 2, wherein the connection layer is over and in contact with each of the plurality of source contacts.

11. A three-dimensional (3D) memory device, comprising:
a memory stack comprising a plurality of memory blocks over a substrate, each of the memory blocks comprising interleaved a plurality of conductor layers and a plurality of insulating layers;
a plurality of channel structures extending vertically in the memory blocks;
a source structure extending between adjacent memory blocks; and
a support structure in contact with the source structure and comprising a plurality of interleaved conductor portions and insulating portions, wherein
adjacent memory blocks are in contact with each other through the support structure, and
a top one of the conductor portions is in direct contact with a top one of the conductor layers in each of the adjacent memory blocks.

12. The 3D memory device of claim 11, wherein the source structure comprises a plurality of source portions, adjacent ones of the source portions are conductively connected to one another.

13. The 3D memory device of claim 12, wherein the source structure further comprises a connection layer in contact with and conductively connected to the adjacent ones of the source portions, the connection layer being a conductive layer.

14. The 3D memory device of claim 13, wherein the connection layer comprises at least one of tungsten, cobalt, aluminum, copper, silicides, or polysilicon.

15. The 3D memory device of claim 14, wherein the connection layer is positioned over each of the adjacent ones of the source portions and the support structure.

16. The 3D memory device of claim 11, wherein
each of the conductor portions is in contact with conductor layers of a same level in the adjacent memory blocks and each of the insulating portions is in contact with insulating layers of the same level in the adjacent memory blocks; and
the conductor portions and the conductor layers comprise the same materials, and the insulating portions and the insulating layers comprise the same materials.

17. A three-dimensional (3D) memory device, comprising:
a memory stack over a substrate, the memory stack comprising interleaved a plurality of conductor layers and a plurality of insulating layers;
a plurality of channel structures extending vertically in the memory stack;
a source structure comprising a plurality of source portions and extending in the memory stack; and
a support structure between adjacent ones of the source portions and comprising a plurality of interleaved conductor portions and insulating portions, wherein
a top one of the conductor portions is coplanar with a top one of the conductor layers, and
adjacent ones of the source portions are conductively connected to one another.

18. The 3D memory device of claim 17, wherein the source structure further comprises a connection layer in contact with and conductively connected to the adjacent ones of the source portions, the connection layer being a conductive layer.

19. The 3D memory device of claim 18, wherein the connection layer comprises at least one of tungsten, cobalt, aluminum, copper, silicides, or polysilicon.

20. The 3D memory device of claim 18, wherein:
the connection layer is positioned over each of the adjacent ones of the source portions; and
the connection layer is over the support structure.

* * * * *